(12) United States Patent
Chen et al.

(10) Patent No.: US 10,475,970 B2
(45) Date of Patent: Nov. 12, 2019

(54) MICRO LIGHT-EMITTING DIODE DISPLAY PANEL AND MANUFACTURING METHOD THEREOF

(71) Applicant: Shenzhen China Star Optoelectronics Technology Co., Ltd., Shenzhen (CN)

(72) Inventors: Lixuan Chen, Shenzhen (CN); Yungjui Lee, Shenzhen (CN)

(73) Assignee: SHENZHEN CHINA STAR OPTOELECTRONICS TECHNOLOGY CO., LTD., Shenzhen, Guangdong (CN)

(*) Notice: Subject to any disclaimer, the term of this patent is extended or adjusted under 35 U.S.C. 154(b) by 200 days.

(21) Appl. No.: 15/115,915

(22) PCT Filed: Jul. 15, 2016

(86) PCT No.: PCT/CN2016/090108
§ 371 (c)(1),
(2) Date: Aug. 2, 2016

(87) PCT Pub. No.: WO2017/215067
PCT Pub. Date: Dec. 21, 2017

(65) Prior Publication Data
US 2018/0219142 A1    Aug. 2, 2018

(30) Foreign Application Priority Data

Jun. 15, 2016   (CN) .......................... 2016 1 0422104

(51) Int. Cl.
*H01L 33/50*      (2010.01)
*H01L 27/15*      (2006.01)
(Continued)

(52) U.S. Cl.
CPC ........ *H01L 33/507* (2013.01); *H01L 25/0753* (2013.01); *H01L 27/156* (2013.01);
(Continued)

(58) Field of Classification Search
CPC ............... H01L 25/167; H01L 25/0753; H01L 27/3246
See application file for complete search history.

(56) References Cited

U.S. PATENT DOCUMENTS 7,038,740 B1 *   5/2006   Katsuya ............ G02F 1/133502
                                                                349/139
2004/0263740 A1* 12/2004  Sakakura ............ H01L 51/5237
                                                                349/138
(Continued)

FOREIGN PATENT DOCUMENTS

CN           105339996 A      2/2016

*Primary Examiner* — Changhyun Yi
(74) *Attorney, Agent, or Firm* — Leong C. Lei

(57) ABSTRACT

A micro LED display panel and a manufacturing method thereof are provided. The micro LED display panel includes: a substrate, a plurality of micro LEDs disposed on the substrate and arranged in an array, a transparent encapsulation layer covering the plurality of micro LEDs, and a quantum dot (QD) layer disposed on the encapsulation layer. By adding the QD layer on the encapsulation layer, the short wavelength light emitted by the micro LEDs excites the QD layer to emit light, so that the micro LEDs and the QD layer form the basic display units of the micro LED display panel to expand the gamut of micro LED display panel and improve display quality of the micro LED display panel.

9 Claims, 3 Drawing Sheets

(51) Int. Cl.
*H01L 33/00* (2010.01)
*H01L 25/075* (2006.01)
*H01L 33/56* (2010.01)

(52) U.S. Cl.
CPC .......... *H01L 33/007* (2013.01); *H01L 33/504* (2013.01); *H01L 33/56* (2013.01); *H01L 2933/005* (2013.01); *H01L 2933/0041* (2013.01)

(56) References Cited

U.S. PATENT DOCUMENTS

| | | | |
|---|---|---|---|
| 2014/0022479 A1* | 1/2014 | Hosaka | G02F 1/1368 349/43 |
| 2014/0027709 A1* | 1/2014 | Higginson | H01L 23/3171 257/13 |
| 2014/0339495 A1* | 11/2014 | Bibl | H01L 33/504 257/13 |
| 2017/0162553 A1* | 6/2017 | Bibl | H01L 25/167 |
| 2017/0287882 A1* | 10/2017 | Cok | H01L 25/0753 |
| 2017/0358623 A1* | 12/2017 | Thothadri | H01L 27/156 |

* cited by examiner

MICRO LIGHT-EMITTING DIODE DISPLAY PANEL AND MANUFACTURING METHOD THEREOF

BACKGROUND OF THE INVENTION

1. Field of the Invention

The present invention relates to the field of display, and in particular to a micro light-emitting diode (micro LED) display panel and manufacturing method thereof.

2. The Related Arts

The panel display device, due to the advantages of high display quality, low power-consumption, thin size and wide application, is widely used in mobile phones, TV, PDA, digital camera, notebook PC, desktop PC, and so on, and becomes the mainstream technology.

The micro LED display device is a display device which utilizes high density micro-scaled LED array integrated on a substrate as display pixels to achieve image display. Similar to a larger-scaled outdoor LED display, each pixel is addressable and individually driven to emit light, and can be viewed as a reduce-sized outdoor LED display by reducing the inter-pixel distance from cm scale to mm scale. Micro LED display device and the organic light-emitting diode (OLED) are both self-luminous, but the micro LED shows the advantages of higher material stability, longer lifespan and no image imprinting as compared to the OLED, and is considered as the major competing technology for OLED display device.

Because of lattice match, micro LED element must be grown on a sapphire substrate by molecular beam epitaxy (MBE) method. To manufacture a display panel, the micro LED element must be transferred from the sapphire substrate to the receiving substrate for forming the display panel. The (micro transfer printing is a technology to transfer the micro LED element grown on the sapphire substrate to the receiving substrate. Specifically, a laser lift-off (LLO) technology is used to separate the micro LED bare chip from the sapphire substrate, and then a patterned polydimethylsiloxane (PDMS) transfer head is used to attract the micro LED bare chip off from the sapphire substrate, the PDMS transfer head is aligned with the receiving substrate for positioning, and then the micro LED bare chip attracted by the PDMS transfer head is attached to the pre-set position on the receiving substrate, and then the PDMS transfer head is lifted off to accomplish micro LED bare chip transfer to form micro LED array substrate. Moreover, the receiving substrate is silicon substrate already prepared with circuit pattern, which may be rigid or flexible.

Because the micro LED display device only utilizing the micro LED as basic display unit has a narrow gamut, to improve the display quality of the micro LED display device, the gamut must be widened.

SUMMARY OF THE INVENTION

The object of the present invention is to provide a micro LED display panel, able to expand the gamut of the micro LED display panel and improve the display quality of the micro LED display panel.

Another object of the present invention is to provide a manufacturing method of micro LED display panel, able to expand the gamut of the micro LED display panel and improve the display quality of the micro LED display panel.

To achieve the above object, the present invention provides a micro LED display panel, which comprises: a substrate, a plurality of micro LEDs disposed on the substrate and arranged in an array, a transparent encapsulation layer covering the plurality of micro LEDs, and a quantum dot (QD) layer disposed on the encapsulation layer.

The substrate is a flexible substrate or a rigid substrate.

The encapsulation layer is made of: parylene or organic resin.

The plurality of micro LEDs comprises: a plurality of red micro LEDs, a plurality of green micro LEDs, and a plurality of blue micro LEDs.

The QD layer comprises: a red QD area disposed on above the plurality of red micro LEDs, a green QD area disposed on above the plurality of green micro LEDs, and a blue QD area disposed on above the plurality of blue micro LEDs.

The present invention also provides a manufacturing method of micro LED display panel, which comprises: Step 1: providing a substrate, forming a plurality of micro LEDs arranged in an array on the substrate; Step 2: covering the plurality of micro LEDs with a transparent encapsulation layer to encapsulate the plurality of micro LEDs; and Step 3: forming a quantum dot (QD) layer on the encapsulation layer.

Specifically, Step 1 comprises: providing a native substrate, forming a plurality of micro LEDs on the native substrate, and transferring the plurality of micro LEDs by micro transfer printing to the substrate; the native substrate is a sapphire-based substrate, and the substrate is a flexible substrate or a rigid substrate.

In Step 2, the encapsulation layer is formed by a spin coating method to cover the plurality of micro LEDs, and the encapsulation layer is made of parylene or organic resin.

The plurality of micro LEDs comprises: a plurality of red micro LEDs, a plurality of green micro LEDs, and a plurality of blue micro LEDs.

The QD layer comprises: a red QD area disposed on above the plurality of red micro LEDs, a green QD area disposed on above the plurality of green micro LEDs, and a blue QD area disposed on above the plurality of blue micro LEDs.

The present invention also provides a micro LED display panel, which comprises: a substrate, a plurality of micro LEDs disposed on the substrate and arranged in an array, a transparent encapsulation layer covering the plurality of micro LEDs, and a quantum dot (QD) layer disposed on the encapsulation layer; wherein the substrate being a flexible substrate or a rigid substrate; wherein the encapsulation layer being made of: parylene or organic resin.

Compared to the known techniques, the present invention provides the following advantages: the present invention provides a micro LED display panel, comprising: a substrate, a plurality of micro LEDs disposed on the substrate and arranged in an array, a transparent encapsulation layer covering the plurality of micro LEDs, and a quantum dot (QD) layer disposed on the encapsulation layer. By adding the QD layer on the encapsulation layer, the short wavelength light emitted by the micro LEDs excites the QD layer to emit light, so that the micro LEDs and the QD layer form the basic display units of the micro LED display panel to expand the gamut of micro LED display panel and improve display quality of the micro LED display panel. The present invention also provides a manufacturing method of micro LED display panel, able to expand the gamut of micro LED display panel and improve display quality of the micro LED display panel.

BRIEF DESCRIPTION OF THE DRAWINGS

To make the technical solution of the embodiments according to the present invention, a brief description of the drawings that are necessary for the illustration of the embodiments will be given as follows. Apparently, the drawings described below show only example embodiments of the present invention and for those having ordinary skills in the art, other drawings may be easily obtained from these drawings without paying any creative effort. In the drawings.

DETAILED DESCRIPTION OF THE PREFERRED EMBODIMENTS

To further explain the technical means and effect of the present invention, the following refers to embodiments and drawings for detailed description.

Figure 1:
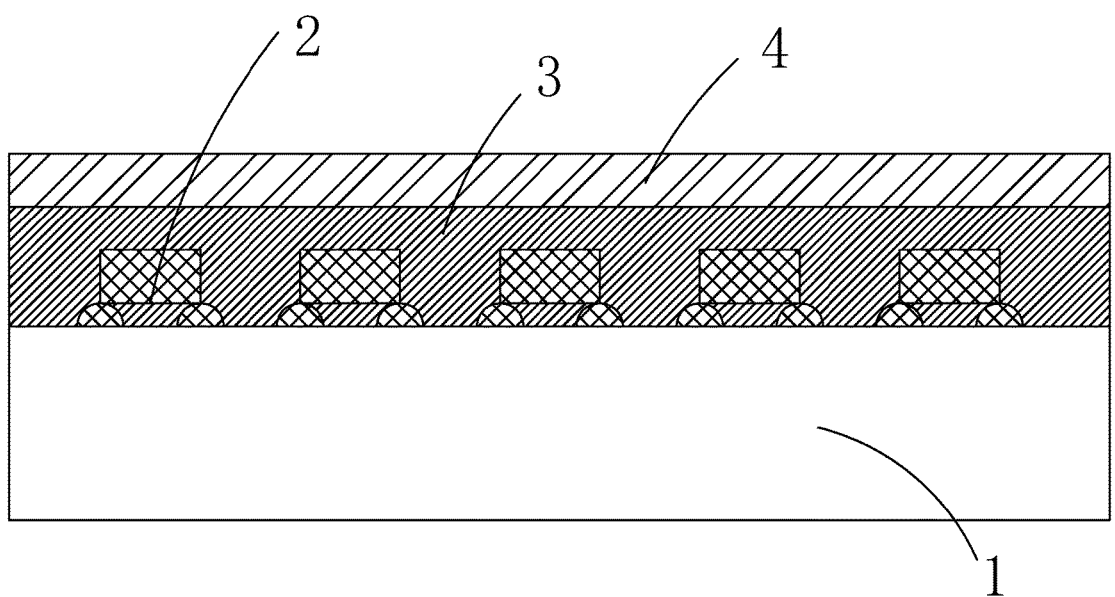
FIG. 1 is a schematic view showing the structure of micro LED display panel provided by a first embodiment of the present invention.
Figure 2:
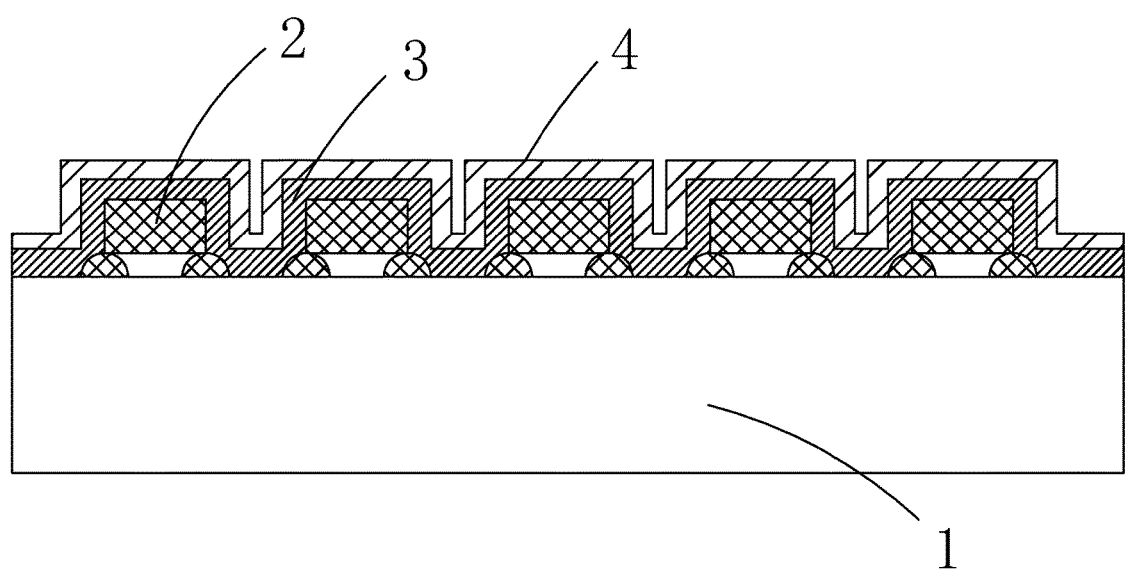
FIG. 2 is a schematic view showing the structure of micro LED display panel provided by a second embodiment of the present invention.

Refer to FIG. 1 and FIG. 2. The present invention provides a micro LED display panel, which comprises: a substrate 1, a plurality of micro LEDs 2 disposed on the substrate 1 and arranged in an array, a transparent encapsulation layer 3 covering the plurality of micro LEDs 2, and a quantum dot (QD) layer 4 disposed on the encapsulation layer 3.

Specifically, the substrate 1 is a flexible substrate or a rigid substrate. The plurality of micro LEDs 2 is transferred by micro transfer printing to the substrate 1. The substrate 1 is disposed with circuit pattern before the transferring to drive the plurality of micro LEDs 2 to emit light. The plurality of micro LEDs 2 can be GaN-based LED, and the substrate 1 is a silicon substrate.

Moreover, the encapsulation layer 3 is to protect the plurality of micro LEDs 2 to prevent humidity and must have good thermal resistance, insulation and film stability. The material can be, but not limited to, all types of parylene or organic resin. The encapsulation layer 3 can be formed by a spin coating method, and has a thickness of 50 nm-0.5 mm. Optionally, as shown in the first embodiment of FIG. 1, the thickness at the encapsulation layer 3 at the gap between the micro LEDs is greater than the thickness at the micro LEDs so that the upper surface of the encapsulation layer 3 is a flat surface. The upper surface of the QD layer 4 is also a flat surface. As shown in the second embodiment of FIG. 2, the thickness at the encapsulation layer 3 at the gap between the micro LEDs is the same as the thickness at the micro LEDs so that the encapsulation layer 3 forms a groove at the gaps between micro LEDs. The QD layer 4 is also forms a groove at the gaps between micro LEDs.

Optionally, the plurality of micro LEDs 2 comprises: a plurality of red micro LEDs, a plurality of green micro LEDs, and a plurality of blue micro LEDs. The QD layer 4 comprises: a red QD area disposed on above the plurality of red micro LEDs, a green QD area disposed on above the plurality of green micro LEDs, and a blue QD area disposed on above the plurality of blue micro LEDs. In other words, the color of emitted light of each area in the QD layer 4 corresponds to the color of the emitted light of the micro LEDs below.

It should be noted that, by adding the QD layer 4 on the encapsulation layer 3, the short wavelength light emitted by the micro LEDs 2 excites the QD layer 4 to emit light, so that the micro LEDs 2 and the QD layer 4 together form the basic display units of the micro LED display panel to expand the gamut of micro LED display panel and improve display quality of the micro LED display panel.

Specifically, the structure of QD material used for the QD layer 4 comprises light-emitting nuclear, inorganic protective shell and surface ligands. For the light-emitting nuclear, for example, the green QD material may comprises indium phosphide (InP), cadmium and selenium sulfide ($Cd_2SSe$), the red QD material may comprise cadmium selenide (CdSe), and indium arsenide (InAs), and so on. The material for inorganic protective shell may comprise the combination of one or more of cadmium sulfide (CdS), zinc selenide (ZnSe), zinc sulfide (ZnS), zinc oxide (ZnO), and so on. The material for surface ligands may comprise R—COOH, R—NH2, or R—SH, wherein R is a straight-chain alkane or alkene molecule of 12 to 20 carbon atoms.

Figure 3:
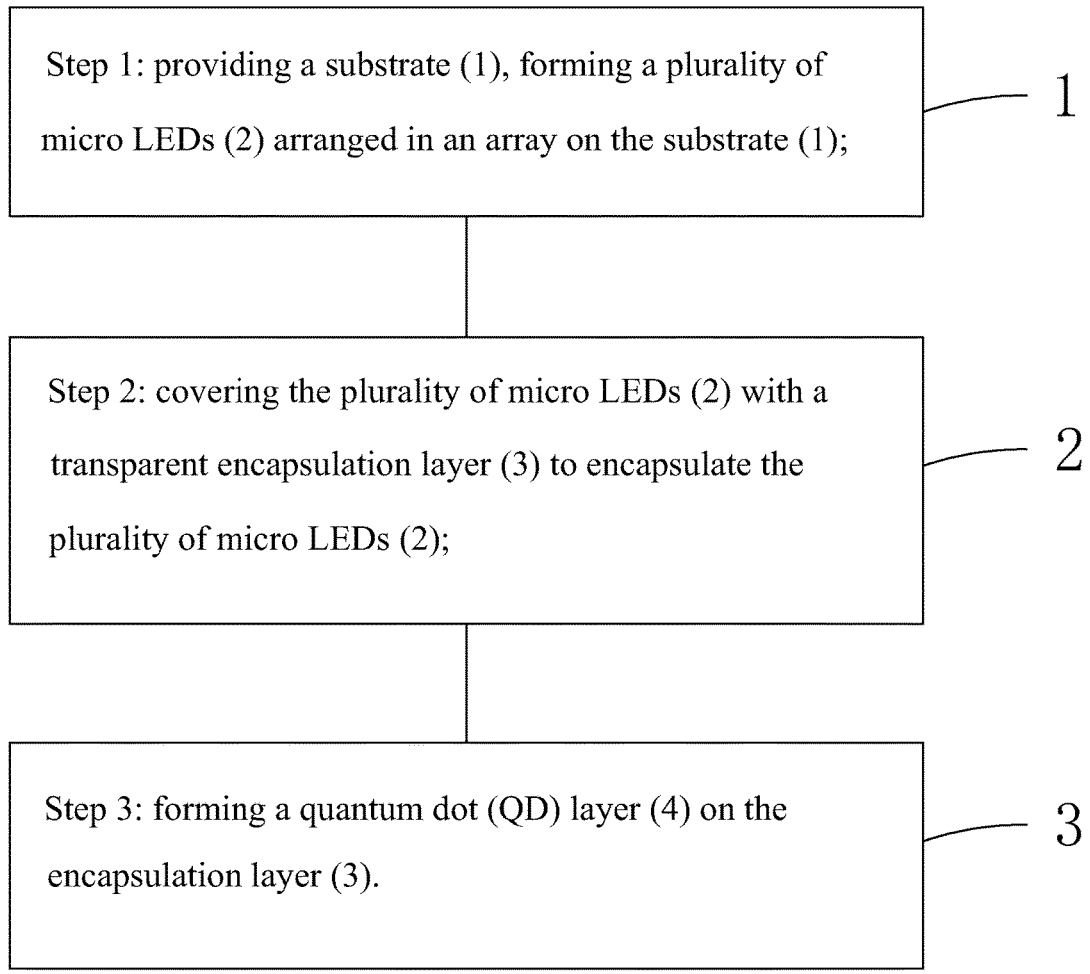
FIG. 3 is a schematic view showing the flowchart of the manufacturing method of micro LED display panel provided by an embodiment of the present invention.

Refer to FIG. 3. The present invention also provides a manufacturing method of micro LED display panel, which comprises:

Step 1: providing a substrate 1, forming a plurality of micro LEDs 2 arranged in an array on the substrate 1.

Specifically, Step 1 comprises: providing a native substrate, forming a plurality of micro LEDs 2 on the native substrate, and transferring the plurality of micro LEDs 2 by micro transfer printing to the substrate 1; the native substrate is a sapphire-based substrate, and the substrate 1 is a flexible substrate or a rigid substrate. The substrate 1 is disposed with circuit pattern before the transferring to drive the plurality of micro LEDs 2 to emit light. The plurality of micro LEDs 2 can be GaN-based LED, and the substrate 1 is a silicon substrate.

Step 2: covering the plurality of micro LEDs 2 with a transparent encapsulation layer 3 to encapsulate the plurality of micro LEDs 2.

Specifically, the encapsulation layer 3 is to protect the plurality of micro LEDs 2 to prevent humidity and must have good thermal resistance, insulation and film stability. The material can be, but not limited to, all types of parylene or organic resin. The encapsulation layer 3 can be formed by a spin coating method, and has a thickness of 50 nm-0.5 mm.

Step 3: forming a QD layer 4 on the encapsulation layer 3.

Optionally, as shown in the first embodiment of FIG. 1, the thickness at the encapsulation layer 3 at the gap between the micro LEDs is greater than the thickness at the micro LEDs so that the upper surface of the encapsulation layer 3 is a flat surface. The upper surface of the QD layer 4 is also a flat surface. As shown in the second embodiment of FIG. 2, the thickness at the encapsulation layer 3 at the gap between the micro LEDs is the same as the thickness at the micro LEDs so that the encapsulation layer 3 forms a groove at the gaps between micro LEDs. The QD layer 4 is also forms a groove at the gaps between micro LEDs.

Optionally, the plurality of micro LEDs 2 comprises: a plurality of red micro LEDs, a plurality of green micro LEDs, and a plurality of blue micro LEDs. The QD layer 4 comprises: a red QD area disposed on above the plurality of red micro LEDs, a green QD area disposed on above the plurality of green micro LEDs, and a blue QD area disposed on above the plurality of blue micro LEDs. In other words, the color of emitted light of each area in the QD layer 4 corresponds to the color of the emitted light of the micro LEDs below.

It should be noted that, by adding the QD layer 4 on the encapsulation layer 3, the short wavelength light emitted by the micro LEDs 2 excites the QD layer 4 to emit light, so that the micro LEDs 2 and the QD layer 4 together form the basic display units of the micro LED display panel to expand the gamut of micro LED display panel and improve display quality of the micro LED display panel.

In summary, the present invention provides a micro LED display panel, which comprises: a substrate, a plurality of micro LEDs disposed on the substrate and arranged in an array, a transparent encapsulation layer covering the plurality of micro LEDs, and a quantum dot (QD) layer disposed on the encapsulation layer. By adding the QD layer on the encapsulation layer, the short wavelength light emitted by the micro LEDs excites the QD layer to emit light, so that the micro LEDs and the QD layer form the basic display units of the micro LED display panel to expand the gamut of micro LED display panel and improve display quality of the micro LED display panel. The present invention also provides a manufacturing method of micro LED display panel, able to expand the gamut of micro LED display panel and improve display quality of the micro LED display panel.

It should be noted that in the present disclosure the terms, such as, first, second are only for distinguishing an entity or operation from another entity or operation, and does not imply any specific relation or order between the entities or operations. Also, the terms "comprises", "include", and other similar variations, do not exclude the inclusion of other non-listed elements. Without further restrictions, the expression "comprises a . . . " does not exclude other identical elements from presence besides the listed elements.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the claims of the present invention.

What is claimed is:

1. A micro light-emitting diode (LED) display panel, which comprises: a substrate, a plurality of micro LEDs disposed on a surface of the substrate and arranged in an array, a transparent encapsulation layer covering the plurality of micro LEDs, and a quantum dot (QD) layer disposed on the encapsulation layer;
    wherein the plurality of micro LEDs are spaced from each other by gaps formed therebetween and the transparent encapsulation layer extends continuously over the plurality of micro LEDs and the gaps between the plurality of micro LEDs, wherein the transparent encapsulation layer comprises first portions that are located on tops of the plurality of micro LEDs, second portions that are arranged in the gaps and are located on the surface of the substrate, and intermediate portions extending between and connected to the first portions and the second portions so that the transparent encapsulation layer forms recesses respectively corresponding to the gaps in order to have the first portions, the second portions, and the intermediate portions to collectively and completely enclose each of the plurality of micro LEDs, wherein the second portions of the transparent encapsulation layer have a thickness that is the same as a thickness of the first portions of the transparent encapsulation layer;
    wherein the plurality of micro LEDs comprises: a plurality of red micro LEDs, a plurality of green micro LEDs, and a plurality of blue micro LEDs; and
    wherein the QD layer comprises: a red QD area disposed on above the plurality of red micro LEDs, a green QD area disposed on above the plurality of green micro LEDs, and a blue QD area disposed on above the plurality of blue micro LEDs.

2. The micro LED display device as claimed in claim 1, wherein the substrate is a flexible substrate.

3. The micro LED display device as claimed in claim 1, wherein the encapsulation layer is made of: parylene or organic resin.

4. The micro LED display device as claimed in claim 1, wherein the substrate is a rigid substrate.

5. A manufacturing method of micro LED display panel, which comprises:
    Step 1: providing a substrate, forming a plurality of micro LEDs arranged in an array on the substrate;
    Step 2: covering the plurality of micro LEDs with a transparent encapsulation layer to encapsulate the plurality of micro LEDs; and
    Step 3: forming a quantum dot (QD) layer on the encapsulation layer;
    wherein the plurality of micro LEDs are spaced from each other by gaps formed therebetween and the transparent encapsulation layer extends continuously over the plurality of micro LEDs and the gaps between the plurality of micro LEDs, wherein the transparent encapsulation layer comprises first portions that are located on tops of the plurality of micro LEDs, second portions that are arranged in the gaps and are located on the surface of the substrate, and intermediate portions extending between and connected to the first portions and the second portions so that the transparent encapsulation layer forms recesses respectively corresponding to the gaps in order to have the first portions, the second portions, and the intermediate portions to collectively and completely enclose each of the plurality of micro LEDs, wherein the second portions of the transparent encapsulation layer have a thickness that is the same as a thickness of the first portions of the transparent encapsulation layer;
    wherein the plurality of micro LEDs comprises: a plurality of red micro LEDs, a plurality of green micro LEDs, and a plurality of blue micro LEDs; and
    wherein the QD layer comprises: a red QD area disposed on above the plurality of red micro LEDs, a green QD area disposed on above the plurality of green micro LEDs, and a blue QD area disposed on above the plurality of blue micro LEDs.

6. The manufacturing method of micro LED display panel as claimed in claim 5, wherein the step 1 comprises:
    providing a native substrate, forming a plurality of micro LEDs on the native substrate, and transferring the plurality of micro LEDs by micro transfer printing to the substrate;
    the native substrate being a sapphire-based substrate; and the substrate being a flexible substrate.

7. The manufacturing method of micro LED display panel as claimed in claim 5, wherein in the step 2, the encapsulation layer is formed by a spin coating method to cover the plurality of micro LEDs; and the encapsulation layer is made of parylene or organic resin.

8. The manufacturing method of micro LED display panel as claimed in claim 5, wherein the step 1 comprises:
provproviding a native substrate, forming a plurality of micro LEDs on the native substrate, and transferring the plurality of micro LEDs by micro transfer printing to the substrate;
the native substrate being a sapphire-based substrate; and the substrate being a rigid substrate.

9. A micro light-emitting diode (LED) display panel, which comprises: a substrate, a plurality of micro LEDs disposed on the substrate and arranged in an array, a transparent encapsulation layer covering the plurality of micro LEDs, and a quantum dot (QD) layer disposed on the encapsulation layer;
wherein the plurality of micro LEDs are spaced from each other by gaps formed therebetween and the transparent encapsulation layer extends continuously over the plurality of micro LEDs and the gaps between the plurality of micro LEDs, wherein the transparent encapsulation layer comprises first portions that are located on tops of the plurality of micro LEDs, second portions that are arranged in the gaps and are located on the surface of the substrate, and intermediate portions extending between and connected to the first portions and the second portions so that the transparent encapsulation layer forms recesses respectively corresponding to the gaps in order to have the first portions, the second portions, and the intermediate portions to collectively and completely enclose each of the plurality of micro LEDs, wherein the second portions of the transparent encapsulation layer have a thickness that is the same as a thickness of the first portions of the transparent encapsulation layer;
wherein the substrate is one of a flexible substrate and a rigid substrate;
wherein the encapsulation layer is made of: parylene or an organic resin;
wherein the plurality of micro LEDs comprises: a plurality of red micro LEDs, a plurality of green micro LEDs, and a plurality of blue micro LEDs; and
wherein the QD layer comprises: a red QD area disposed on above the plurality of red micro LEDs, a green QD area disposed on above the plurality of green micro LEDs, and a blue QD area disposed on above the plurality of blue micro LEDs.

* * * * *